(12) United States Patent
Azuma et al.

(10) Patent No.: US 9,227,387 B2
(45) Date of Patent: Jan. 5, 2016

(54) ELECTRONIC COMPONENT MOUNTING SYSTEM, ELECTRONIC COMPONENT MOUNTING METHOD, AND ELECTRONIC COMPONENT MOUNTING MACHINE

(71) Applicant: PANASONIC INTELLECTUAL PROPERTY MANAGEMENT CO., LTD., Osaka (JP)

(72) Inventors: Naoki Azuma, Yamanashi (JP); Masayuki Kuwabara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/574,729

(22) Filed: Dec. 18, 2014

(65) Prior Publication Data
US 2015/0176779 A1    Jun. 25, 2015

(30) Foreign Application Priority Data
Dec. 20, 2013  (JP) .................................. 2013-263436

(51) Int. Cl.
| | |
|---|---|
| B23K 31/02 | (2006.01) |
| B32B 37/18 | (2006.01) |
| B23K 1/00 | (2006.01) |
| B32B 37/12 | (2006.01) |
| B23K 1/005 | (2006.01) |
| H05K 13/04 | (2006.01) |
| H05K 13/00 | (2006.01) |

(52) U.S. Cl.
CPC .............. *B32B 37/18* (2013.01); *B23K 1/005* (2013.01); *B23K 1/0016* (2013.01); *B32B 37/12* (2013.01); *H05K 13/0465* (2013.01); *B32B 2457/00* (2013.01); *H05K 13/0015* (2013.01)

(58) Field of Classification Search
None
See application file for complete search history.

(56) References Cited

U.S. PATENT DOCUMENTS

| | | | | |
|---|---|---|---|---|
| 5,844,146 | A | * | 12/1998 | Murray et al. ............ 73/862.043 |
| 5,867,260 | A | * | 2/1999 | Sakai ......................... 356/237.3 |
| 5,943,586 | A | * | 8/1999 | Koizumi et al. .............. 438/401 |
| 6,581,817 | B2 | * | 6/2003 | Kawashima et al. .......... 228/6.2 |
| 2002/0024808 | A1 | * | 2/2002 | Suehiro et al. ................ 362/245 |
| 2004/0134968 | A1 | * | 7/2004 | Opper ............................ 228/103 |
| 2005/0077340 | A1 | * | 4/2005 | Nagafuku et al. ................ 228/8 |

(Continued)

FOREIGN PATENT DOCUMENTS

| | | | | | |
|---|---|---|---|---|---|
| JP | 59094886 | A | * | 5/1984 | .............. H01L 31/12 |
| JP | 02154482 | A | * | 6/1990 | .............. H01L 33/00 |

(Continued)

*Primary Examiner* — Kiley Stoner
(74) *Attorney, Agent, or Firm* — Pearne & Gordon LLP

(57) ABSTRACT

In an electronic component mounting method, a light-emitting element is temporarily fixed to a board by solder paste and adhesive, the adhesive is cured to fix a main body of the light-emitting element to the board, and solder is melted to bond a terminal of the light-emitting element to the board. The method includes: detecting a positional deviation of an emission portion in a top surface of the light-emitting element; detecting a position of the light-emitting element in a state in which the light-emitting element is held by an absorption nozzle; positioning the emission portion to a prescribed position on the board based on the positional deviation and the position of the light-emitting element; mounting the light-emitting element on the board at a position deviated from the prescribed position by the positional deviation; curing the adhesive; and heating the board to melt the solder.

9 Claims, 8 Drawing Sheets

(56) References Cited

U.S. PATENT DOCUMENTS

| | | | |
|---|---|---|---|
| 2005/0230853 A1* | 10/2005 | Yoshikawa | 257/E25.032 |
| 2007/0201247 A1* | 8/2007 | Ohno et al. | 362/631 |
| 2008/0087900 A1* | 4/2008 | Yang | 257/82 |
| 2009/0078743 A1* | 3/2009 | Ho et al. | 228/105 |
| 2009/0127315 A1* | 5/2009 | Okita | 228/102 |
| 2009/0246402 A1* | 10/2009 | Mataki et al. | 427/534 |
| 2010/0061211 A1* | 3/2010 | Yajima et al. | 369/100 |
| 2011/0204400 A1* | 8/2011 | Koizumi et al. | 257/98 |
| 2012/0051684 A1* | 3/2012 | Hodono | 385/12 |
| 2012/0175404 A1* | 7/2012 | Lai | 228/102 |
| 2012/0175667 A1* | 7/2012 | Golle et al. | 257/99 |
| 2012/0196388 A1* | 8/2012 | Tanaka | 438/16 |
| 2013/0264602 A1* | 10/2013 | Namiki et al. | 257/98 |
| 2013/0306964 A1* | 11/2013 | Han | 257/43 |
| 2014/0120641 A1* | 5/2014 | Kim | 438/27 |
| 2014/0160695 A1* | 6/2014 | Jeong et al. | 361/749 |
| 2014/0332820 A1* | 11/2014 | Han et al. | 257/76 |
| 2015/0062904 A1* | 3/2015 | Sanga | 362/260 |
| 2015/0087092 A1* | 3/2015 | Goto | 438/27 |
| 2015/0166847 A1* | 6/2015 | Morita et al. | |
| 2015/0176769 A1* | 6/2015 | Lee | |
| 2015/0197672 A1* | 7/2015 | Namiki et al. | |
| 2015/0209914 A1* | 7/2015 | Ishigami et al. | |

FOREIGN PATENT DOCUMENTS

| | | | | |
|---|---|---|---|---|
| JP | 05109788 A | * | 4/1993 | H01L 21/52 |
| JP | 05109789 A | * | 4/1993 | H01L 21/52 |
| JP | 2981385 B2 | * | 11/1999 | |
| JP | 2004-341108 A | | 12/2004 | |
| JP | 2012-042670 A | | 3/2012 | |
| JP | 2012-243713 A | | 12/2012 | |
| KR | 101338972 B1 | * | 12/2013 | |

* cited by examiner

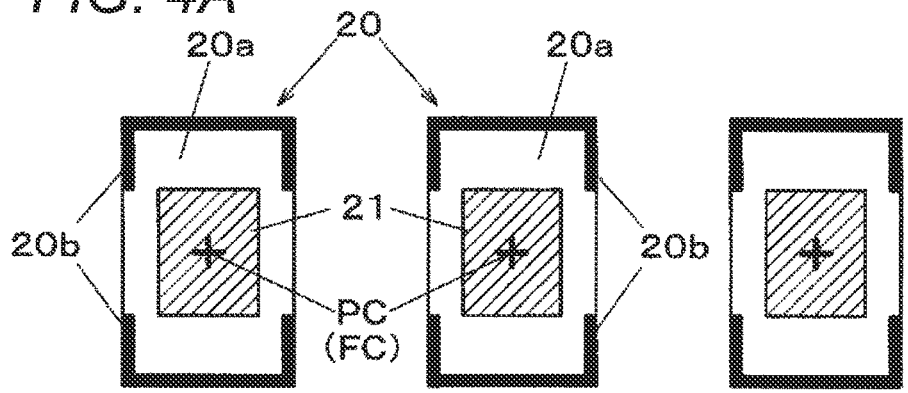
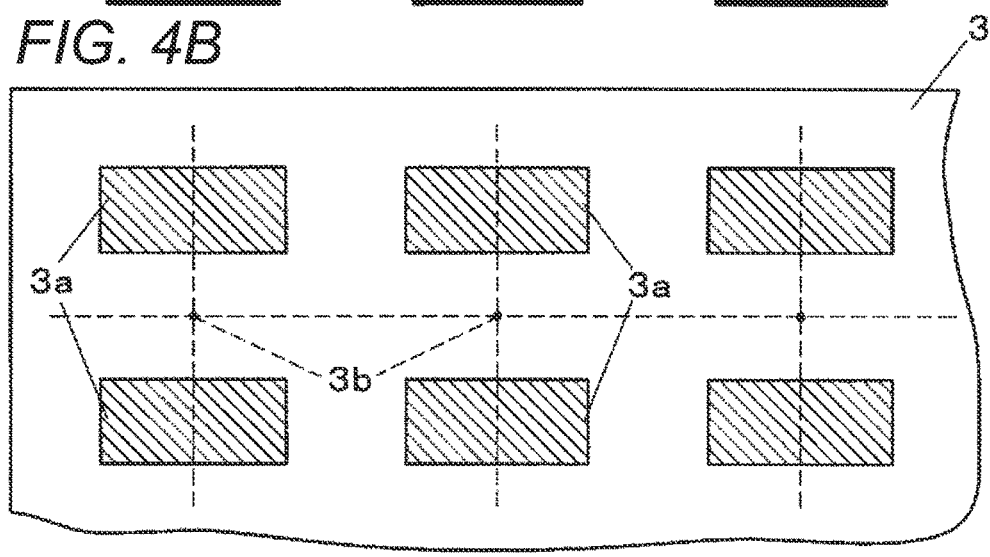
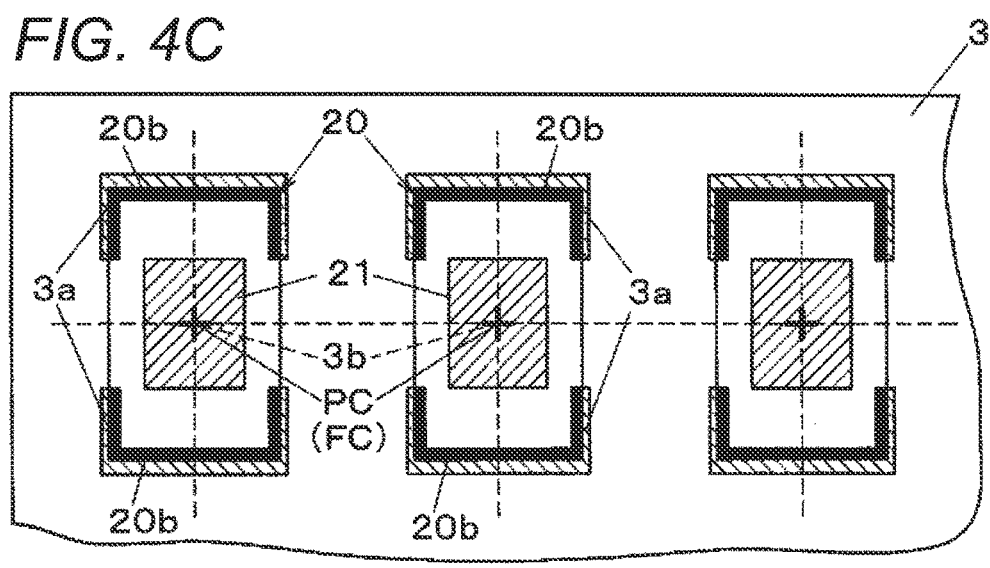

FIG. 7
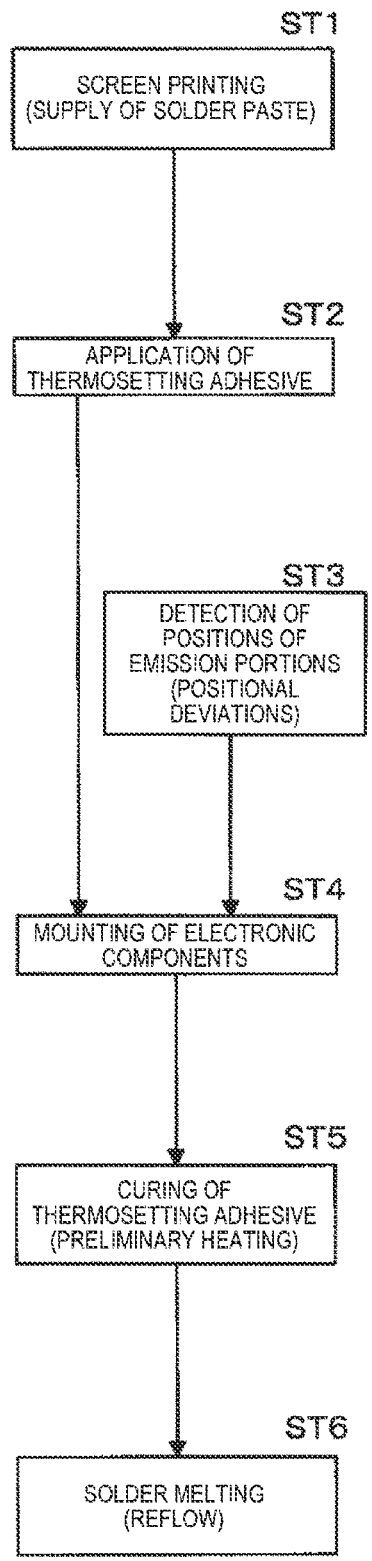
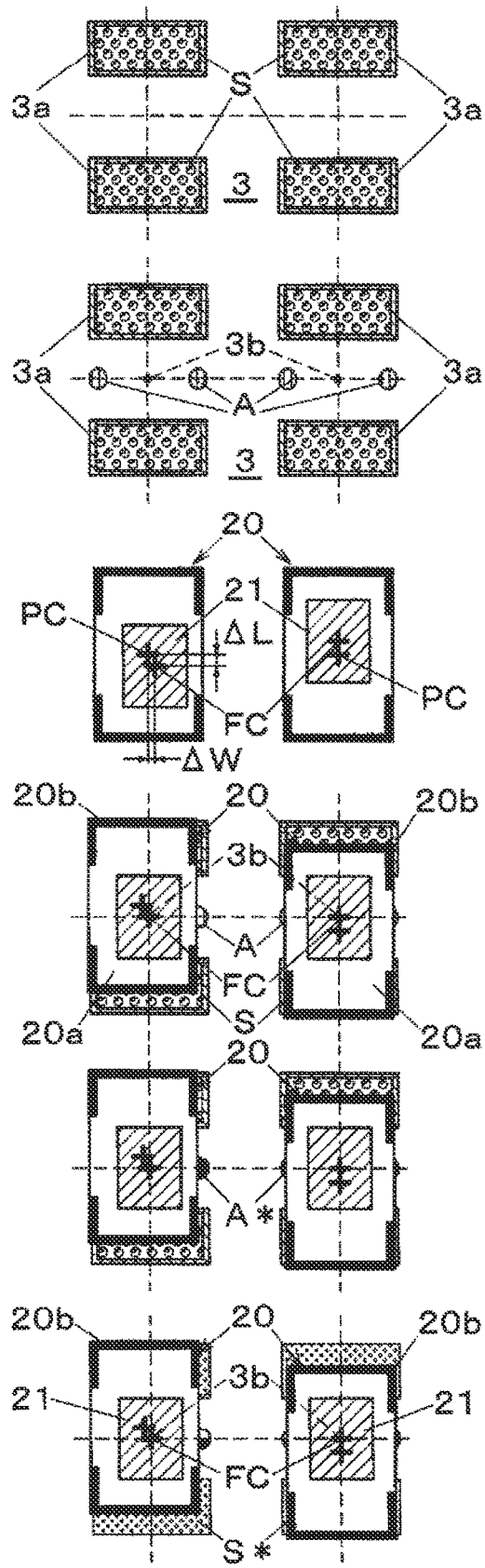

ELECTRONIC COMPONENT MOUNTING SYSTEM, ELECTRONIC COMPONENT MOUNTING METHOD, AND ELECTRONIC COMPONENT MOUNTING MACHINE

BACKGROUND

1. Technical Field

One or more aspects of the present invention relates to an electronic component mounting system and an electronic component mounting method for mounting a light-emitting element as an electronic component on a board by soldering, and an electronic component mounting machine used in the electronic component mounting system.

2. Background Art

There is broad use of an illumination board serving as an illumination device in which light-emitting elements such as LEDs are mounted on a board. The illumination board is described, for example, in JP-A-2004-341108, JP-A-2012-42670, and JP-A-2012-243713. In the illumination board, since the emission light quantity of a single light-emitting element is small, many light-emitting elements are mounted on a board, and the illumination board is formed such that an optical array in which a plurality of light concentration elements are integrated on the element mounting surface, thereby increasing the efficiency of use of light beams emitted from the light-emitting elements.

In recent years, in an illumination board having the above configuration, soldering process is used for mounting (connecting) light-emitting elements on a board, such as mounting method for ordinary components. This method can reduce consumption of power by virtue of reduction of the resistances of connection of light-emitting elements to a board and reduce the manufacturing cost of the illumination board.

SUMMARY

However, when light-emitting elements are mounted on a board by soldering, the following problem arises due to a variation of a reference position (emission center) of the light-emitting element and self-alignment action that is unique to soldering. In a manufacturing process of a light-emitting element, the external-shape-based management of the reference position is not necessarily performed strictly, and as a result, the reference position of the light-emitting element has a variation.

As for the soldering, because of the self-alignment action in which the terminal of the light-emitting element is attracted by a bonding electrode due to surface tension of molten solder, a bonding position at which the light-emitting element is bonded to the board by the soldering does not necessarily coincide with a mounting position at which the light-emitting element is mounted on the board bearing a print of solder. Therefore, with the above-described techniques, it is difficult to apply soldering process to a method for mounting a light-emitting element which requires accurate positioning of its reference position with respect to a board. Therefore, a new technique for solving this problem is desired.

An object of one or more aspects of the present invention is to provide an electronic component mounting system, an electronic component mounting method, and an electronic component mounting machine which can mount a light-emitting element as an electronic component on a board by soldering with high positioning accuracy.

According to a first aspect of the present invention, there is provided an electronic component mounting system for mounting a light-emitting element as an electronic component on a board by soldering, the electronic component mounting system including: a solder paste supply unit which places solder paste on a pair of lands formed on a top surface of the board; an adhesive applying unit which places adhesive for fixing of the light-emitting element to the board, on the board between the lands; an emission portion detecting unit which detects a positional deviation of an emission portion formed in a top surface of the light-emitting element; a light-emitting element position detecting unit which detects a position of the light-emitting element based on an image of a back surface of the light-emitting element which is obtained in a state in which the top surface of the light-emitting element is absorbed and held by an absorption nozzle of an electronic component mounting machine; a light-emitting element positioning unit which positions the light-emitting element with respect to the board by shifting the light-emitting element by its positional deviation by moving the absorption nozzle relative to the board using the positional deviation detected by the emission portion detecting unit and the position of the light-emitting element detected by the light-emitting element position detecting unit, to place the emission portion at a prescribed position on the board; a light-emitting element mounting unit which lowers the absorption nozzle toward the board such that terminals of the light-emitting element contact the solder paste formed on the respective lands and such that a main body of the light-emitting element contacts the adhesive formed on the board; an adhesive cuing unit which cures the adhesive and which fixes the light-emitting element to the board; and a reflow unit which melts solder in the solder paste in a state in which the light-emitting element is fixed to the board by the cured adhesive and which connects the terminals of the light-emitting elements to the respective lands of the board electrically and mechanically.

According to a second aspect of the present invention, there is provided an electronic component mounting method for mounting a light-emitting element as an electronic component on a board by soldering, the electronic component mounting method including: placing solder paste on a pair of lands formed on a top surface of the board; placing adhesive for fixing of the light-emitting element to the board, on the board between each of the pairs of lands; detecting a positional deviation of an emission portion formed in a top surface of the light-emitting element; detecting a position of the light-emitting element based on an image of a back surface of the light-emitting element which is obtained in a state in which the top surface of the light-emitting element is absorbed and held by an absorption nozzle of an electronic component mounting machine; positioning the light-emitting element with respect to the board by shifting the light-emitting element by its positional deviation by moving the absorption nozzle relative to the board using the detected positional deviation and the detected position of the light-emitting element, to place the emission portion at a prescribed position on the board; lowering the absorption nozzle toward the board such that terminals of the light-emitting element contact the solder paste formed on the respective lands and such that a main body of the light-emitting element contacts the adhesive formed on the board; curing the adhesive and fixing the light-emitting element to the board; and performing reflow process to melt solder in the solder paste in a state in which the light-emitting element is fixed to the board by the cured adhesive, and connecting the terminals of the light-emitting element to the respective lands of the board electrically and mechanically.

According to a third aspect of the present invention, there is provided an electronic component mounting machine which is used in an electronic component mounting system for mounting a light-emitting element as an electronic component on a board by soldering, and which mounts a light-emitting element on the board in which solder paste is formed on a pair of lands formed on a top surface of the board and places adhesive for fixing of the light-emitting elements to the board on the board between the lands, the electronic component mounting machine including: an emission portion detecting unit which detects a positional deviation of an emission portion formed in a top surface of the light-emitting element; a light-emitting element position detecting unit which detects a position of the light-emitting element based on an image of a back surface of the light-emitting element which is obtained in a state in which the top surface of the light-emitting element is absorbed and held by an absorption nozzle; a light-emitting element positioning unit which positions the light-emitting element with respect to the board by shifting the light-emitting element by its positional deviation by moving the absorption nozzle relative to the board using the positional deviation detected by the emission portion detecting unit and the position of the light-emitting element detected by the light-emitting element position detecting unit, to place the emission portion at a prescribed position on the board; a light-emitting element mounting unit which lowers the absorption nozzle toward the board such that terminals of the light-emitting element contact the solder paste formed on the respective lands and such that a main body of the light-emitting element contacts the adhesive formed on the board.

According to a fourth aspect of the present invention, there is provided an electronic component mounting method in which a light-emitting element is mounted as an electronic component on a board, the light-emitting element including a main body, a terminal formed on the main body, and an emission portion formed in a top surface of the main body, such that the light-emitting element is temporarily fixed to the board by solder paste and adhesive, the adhesive is cured to form an adhesive portion which fixes the main body of the light-emitting element to the board, and solder in the solder paste is melted to form a solder portion which bonds the terminal of the light-emitting element to a land of the board electrically and mechanically; the electronic components mounting method including: detecting a positional deviation of the emission portion in a top surface of the light-emitting element; holding the light-emitting element by an absorption nozzle; detecting a position of the light-emitting element in a state in which the light-emitting element is held by the absorption nozzle; positioning the emission portion to a prescribed position on the board by moving the absorption nozzle based on the positional deviation of the emission portion and the position of the light-emitting element; lowering the absorption nozzle to mount the light-emitting element on the board at a position deviated from the prescribed position on the board by the positional deviation; curing the adhesive to form the adhesive portion; and heating the board which is mounted with the light-emitting element to melt the solder to form the solder portion.

According to one or more aspects of the present invention, it is possible to mount the light-emitting element as an electronic component on the board by soldering with high positioning accuracy.

BRIEF DESCRIPTION OF THE DRAWINGS

FIGS. 4A-4C illustrate a mounting positioning rule for ideal light-emitting elements in an electronic component mounting method according to the first embodiment of the invention;

FIG. 7 illustrates steps of the electronic component mounting method according to the first embodiment of the invention.

DETAILED DESCRIPTION

Figure 1:
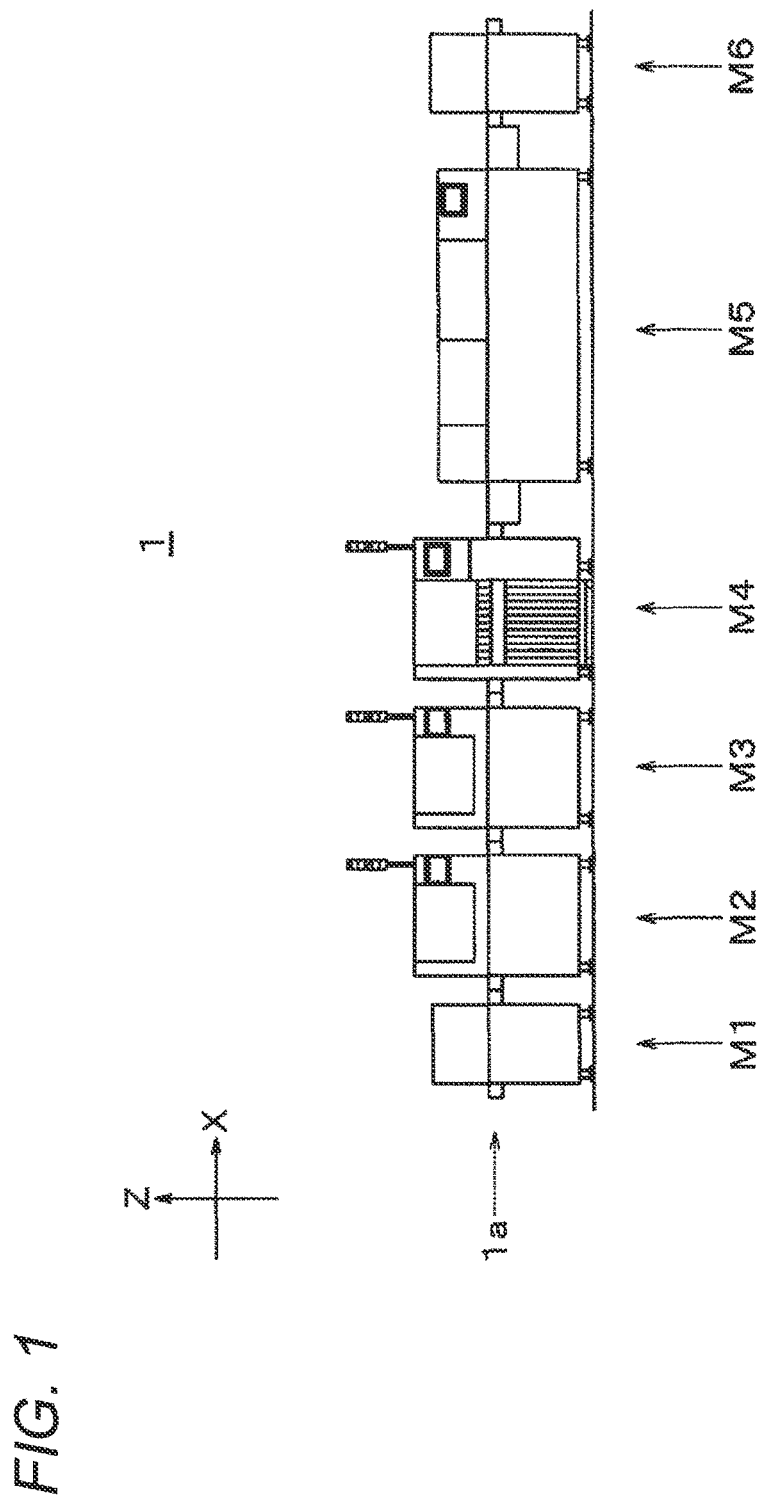
FIG. 1 shows the configuration of an electronic component mounting system according to a first embodiment of the present invention.

A first embodiment of the present invention will be hereinafter described with reference to the drawings. First, the configuration of an electronic component mounting system 1 will be described with reference to FIG. 1, which has a function of producing an illumination board by mounting light-emitting elements (electronic components) such as LEDs on a board by soldering. The electronic component mounting system 1 is mainly composed of a component mounting line 1a which is configured in such a manner that a screen printing machine M2, an adhesive applying machine M3, an electronic component mounting machine M4, and a reflow machine M5 which are machines for mounting electronic components and which are connected to each other in cascade and disposed between a board supply machine M1 and a board take-up machine M7 which have functions of supplying and taking up a mounting subject board, respectively.

Board conveying units of the individual machines of the component mounting line 1a are connected to each other in cascade to form a board conveyance path having a common pass line. An electronic component mounting operation is performed to mount light-emitting elements 20 (see FIGS. 4A-4C to FIGS. 6A-6C) on a board 3 (see FIG. 2 and FIGS. 4A-4C) being conveyed along the board conveyance path by means of the screen printing machine M2, the adhesive applying machine M3, the electronic component mounting machine M4, and the reflow machine M5.

More specifically, a board 3 that has been supplied by the board supply machine M1 is carried into the screen printing machine M2, where a screen printing operation of forming a print of solder paste S (see FIG. 7) for bonding of components on the board 3 is performed. The board 3 that has been subjected to the screen printing operation is transferred to the adhesive applying machine M3, where adhesive A (see FIG. 7) for fixing of light-emitting elements 20 to the board 3 is applied at prescribed application positions. The board 3 that has been subjected to the application of the adhesive A is transferred to the electronic component mounting machine M4, where a component mounting operation of mounting light-emitting elements 20 to the board 3 on and to which the print of the solder paste S has been formed and the adhesive A has been applied is performed.

The board 3 that has been subjected to the component mounting operation is carried into the reflow machine M5, where it is heated according to a prescribed heating profile. That is, preliminary heating is performed to cure the adhesive A (thermosetting adhesive) that was applied in the adhesive applying machine M3. As a result, the light-emitting elements 20 are fixed to the board 3 at the same positions as they were mounted. Then main heating for soldering is performed in the state that the light-emitting elements 20 are fixed to the board 3 by the adhesive A: the solder in the solder paste S is melted and then solidified in this state. Thus, the terminals of each light-emitting element 20 are connected to respective lands 3a electrically and mechanically. As a result, an illumination board in which the light-emitting elements 20 are mounted on the board 3 is completed and taken up by the board take-up machine M6.

In the embodiment having the above configuration, the reflow machine M5 serves as not only an adhesive curing unit for fixing light-emitting elements 20 to a board 3 by curing adhesive A that was applied in the adhesive applying machine M3 but also a reflow unit for connecting the terminals of each light-emitting element 20 to lands 3a electrically and mechanically by melting the solder in solder paste S in a state that the light-emitting elements 20 are fixed to the board 3 by the cured adhesive A.

The embodiment employs, as the adhesive A, a thermosetting adhesive whose curing reaction peaks at a lower temperature than the melting temperature of solder in the solder paste S, such as one in which a peak of curing reaction as measured by differential scanning calorimetry appears at a lower temperature than the melting temperature of solder in the solder paste S. Accordingly, the above-mentioned adhesive curing unit is a preliminary heating unit which heats a board 3 at a temperature that is lower than the melting temperature of the solder and higher than or equal to a temperature at which the curing reaction of the thermosetting adhesive starts to be promoted. And the above-mentioned reflow unit operates in such a form as to heat the board 3, continuously with the heating by the preliminary heating unit, at a temperature that is higher than or equal to the melting temperature of the solder. This form of heating is realized by a heating profile curing function of the reflow machine M5.

The adhesive A that is applied in the adhesive applying machine M3 may be a photocurable adhesive having, as a component, a UV curable resin instead of a thermosetting adhesive. In this case, a light illumination unit such as UV illumination apparatus for emitting light for accelerating curing of a photocurable adhesive may be disposed upstream of or inside the reflow machine M5 as an adhesive curing unit for fixing light-emitting elements 20 to a board 3 by curing adhesive A that was applied in the adhesive applying machine M3.

Figure 2:
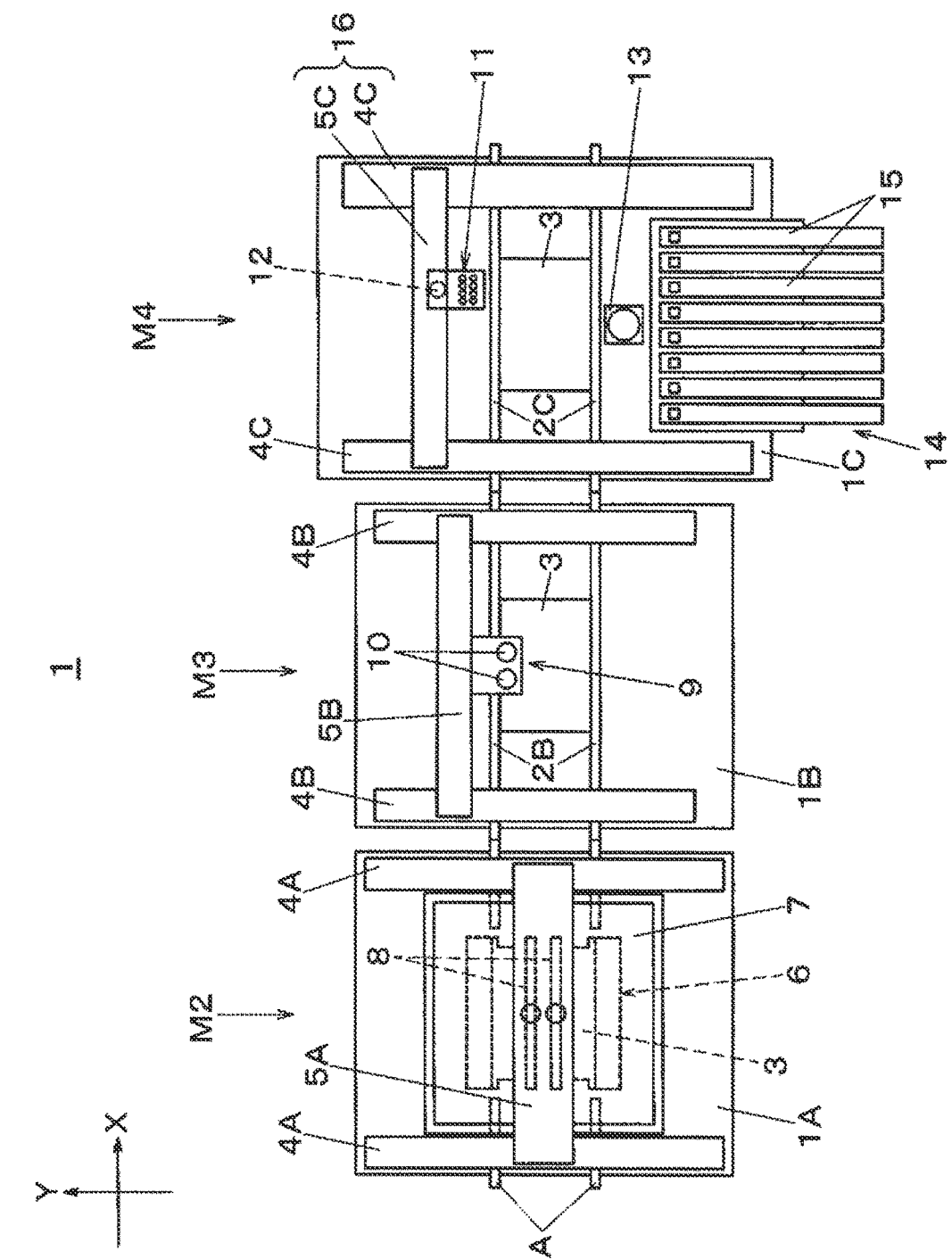
FIG. 2 is a plan view of part of the electronic component mounting system according to the first embodiment of the invention.

Next, the configurations of the screen printing machine M2, the adhesive applying machine M3, the electronic component mounting machine M4 according to the first embodiment will be described with reference to FIG. 2. As shown in FIG. 2, a board conveyance path for conveying a board 3 is formed in the electronic component mounting system 1 in such a manner that board conveying mechanisms 2A, 2B, and 2C are disposed in cascade in the board conveying direction (X direction) at the centers of base stages 1A, 1B, and 1C of the screen printing machine M2, the adhesive applying machine M3, and the electronic component mounting machine M4, respectively.

A Y-axis moving mechanism 4A, 4B, or 4C is erected from the top surface of each of the base stages 1A, 1B, and 1C at both ends in the Y direction. A squeegee table 5A and X-axis moving mechanisms 5B and 5C are disposed on the Y-axis moving mechanisms 4A, 4B, and 4C, respectively so as to be movable in the Y direction. The set of the Y-axis moving mechanism 4A and the X-axis moving mechanism 5B and the set of the Y-axis moving mechanism 4C and the X-axis moving mechanism 5C each constitute a working head moving mechanism for moving a working head that performs each component mounting operation to be described below in the adhesive applying machine M3 or the electronic component mounting machine M4.

The screen printing machine M2 is equipped with a board positioning unit 6 which positions and holds a board 3. The board positioning unit 6 positions, with respect to a screen mask 7 disposed over the board positioning unit 6, a board that 3 that has been carried into the screen printing machine M2 by the board conveying mechanism 2A. Screen printing squeegee heads 8 are mounted on the bottom surface of the squeegee table 5A so as to be able to be elevated and lowered with respect to the screen mask 7. When the Y-axis moving mechanism 4A is driven in a state that one of the squeegee heads 8 is lowered, the one squeegee head 8 slides in the Y direction on the top surface of the screen mask 7 and thereby performs a screen printing operation.

Pattern holes (not shown) are formed through the screen mask 7 so as to correspond to solder printing portions (i.e., pairs of lands 3a formed on the board 3 (see FIGS. 4B and 4C)) of the board 3. Screen printing operation is performed by one of the squeegee heads 8 on the screen mask 7 to which solder paste S is supplied in a state that the board 3 being held by the board positioning unit 6 is in contact with the screen mask 7, whereby solder paste S for bonding of a component is placed on the lands 3a of the board 3. As such, the screen printing machine M2 serves as a paste supply unit for placing solder paste S on the pairs of lands 3a which are formed on the top surface of the board 3.

The board conveying mechanism 2B of the adhesive applying machine M3 carries the screen-printing-completed board 3 into the adhesive applying machine M3 and positions it. The X-axis moving mechanism 5B is mounted with dispensers 10 for discharging adhesive A. Adhesive A can be applied to the top surface of the board 3 at prescribed application positions by positioning an application head 9 with respect to the board 3 by driving the Y-axis moving mechanism 4B and the X-axis moving mechanism 5B. In the embodiment, thermosetting adhesive A for fixing of light-emitting elements 20 is placed at the prescribed application positions that are set between the pairs of lands 3a (see FIG. 7). As such, the adhesive applying machine M3 serves as an adhesive applying unit for placing adhesive A for fixing light-emitting elements 20 to the board 3 on the top surface of the board 3 between the pairs of lands 3a.

The board conveying mechanism 2C of the electronic component mounting machine M4 carries the adhesive-application-completed board 3 into the electronic component mounting machine M4 and positions it. A component supply unit 14 in which plural tape feeders 15 are arranged is disposed on one side of the board conveying mechanism 2C. Each tape feeder 15 supplies light-emitting elements 20 to a component pick-up position for a component mounting head 11 by feeding, pitch by pitch, a tape that holds light-emitting elements 20 (mounting subject electronic component). The component supply unit 14 may be provided with a tray feeder which supplies light-emitting elements 20 that are held by a tray, instead of the tape feeders 15.

A component recognition camera 13 is disposed between the board conveying mechanism 2C and the component supply unit 14. The X-axis moving mechanism 5C is mounted with a component mounting head 11 having plural absorption nozzles each for absorbing and holding a light-emitting element 20. A board recognition camera 12 which is moved together with the component mounting head 11 is mounted on the bottom surface of the X-axis moving mechanism 5C. The Y-axis moving mechanism 4C and the X-axis moving mechanism 5C constitute a mounting head moving mechanism 16 for moving the component mounting head 11. Thus, the component mounting head 11 can be moved, together with the board recognition camera 12, to any position over the component supply unit 14 or the board 3 by driving the mounting head moving mechanism 16.

As the component mounting head 11 is moved over the board 3, an image of recognition targets such as a board recognition mark 3c (see FIG. 6B) that is formed on the top surface of the board 3 is obtained by the board recognition camera 12. Light-emitting elements 20 can be picked up from the tape feeders 15 when the component mounting head 11 is moved to over the component supply unit 14. Thus, a component mounting operation of moving and mounting light-emitting elements 20 to and on the board 3 that is positioned and held by the board conveying mechanism 2C is performed.

The component mounting head 11 is moved to over the component recognition camera 13 sometime in a process that it is moved from the component supply unit 14 to the board 3. In this state, the component recognition camera 13 obtains, from below, an image of the light-emitting element 20 being held by the component mounting head 11. In a component mounting operation of mounting a light-emitting element 20 on the board 3, each light-emitting element 20 is positioned with respect to the board 3 based on results of pieces of recognition processing on a result of obtaining the image of the board 3 by the board recognition camera 12 and a result of obtaining the image of the light-emitting element 20.

Positioning of each light-emitting element 20 with respect to a board 3 will now be described in detail with reference to FIGS. 4A-4C to FIGS. 6A-6C. FIGS. 4A-4C show a state in which light-emitting elements 20 (electronic component) are ideal components that were produced accurately, that is, exactly according to their design specification, and individual portions of each light-emitting element 20 have no dimensional errors such as positional deviations. As shown in FIG. 4A, each light-emitting element 20 is mainly formed by a rectangular main body 30a whose top surface (functional surface) is formed with an emission portion 21. Soldering terminals 20b are formed at the two respective ends, in the longitudinal direction, of the main body 20a. The emission portion 21 is configured in such a manner that the top surface of an LED (light emission source) is covered with a phosphor. The design specification of each light-emitting element 20 stipulates that the emission portion 21 should be symmetrical with respect to the center of the main body 20a and that a component center PC that is the center of the light-emitting element 20 should coincide with an emission portion position FC that is the center of the emission portion 21.

FIG. 4B shows part of a board 3 on which plural light-emitting elements 20 are to be mounted by soldering. Pairs of soldering lands 3a are formed on the mounting surface of the board 3. The center of each pair of lands 3a is a mounting coordinates point 3b that is a target of mounting of a light-emitting element 20. In a state that a light-emitting element 20 is mounted by soldering, its emission portion position FC is required to coincide with the mounting coordinates point 3b.

FIG. 4C shows a state that ideal components as shown in FIG. 4A are mounted on the board 3. In FIGS. 4A-4C and FIGS. 6A-6C, neither solder paste S for soldering nor fixing adhesive A is shown. An aim is to equalize the emission portion position FC of each mounted light-emitting element 20 with the mounting coordinates point 3b of the corresponding pair of lands 3a. In the case of an ideal component, since the emission portion position FC coincides with the component center PC, the desired aim of positioning can be attained by positioning the component center PC on that it coincides with the mounting coordinates point 3b.

Figure 5:
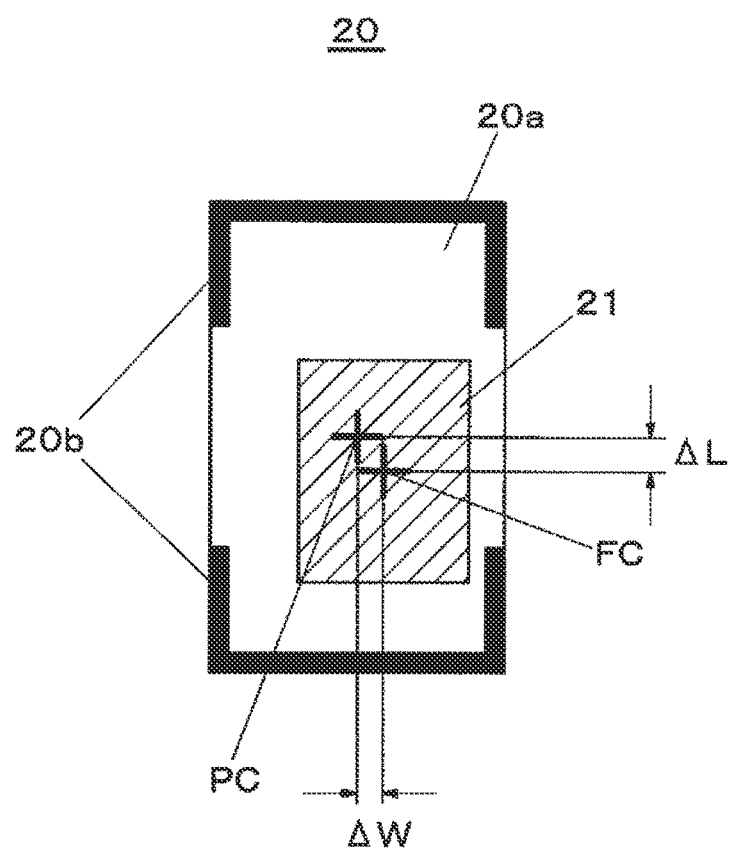
FIG. 5 is a plan view of a light-emitting element (electronic component) to be mounted by the electronic component mounting system according to the first embodiment of the invention.

FIG. 5 shows a light-emitting element 20 that is used in an actual production site. In a manufacturing process of light-emitting elements 20, the position of the emission portion 21 with respect to the external shape of the main body 20a is not necessarily managed strictly and hence the emission portion position FC varies from one component to another. The emission portion position FC which is the center of the emission portion 21 does not coincide with the component center PC which is the center of the light-emitting element 20 due to, for example, a position deviation that occurs when an LED is mounted in the main body 20a and an error that occurs at the time of cutting into an individual component after mounting of the LED. That is, positional deviations $\Delta W$ and $\Delta L$ occur in the width direction and the length direction, respectively. Therefore, if a light-emitting element 20 having such positional deviations $\Delta W$ and $\Delta L$ is mounted according to a positioning rule (i.e., the component center PC is positioned so as to coincide with the mounting coordinates point 3b), the emission portion position FC which should coincide with the mounting coordinates point 3b deviates from it.

Figure 6A:
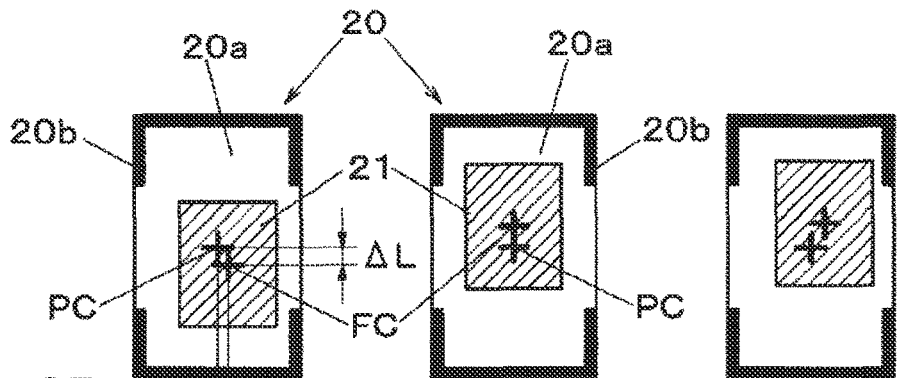
FIGS. 6A-6C illustrate how light-emitting elements are positioned in the electronic component mounting method according to the first embodiment of the invention.
Figure 6B:
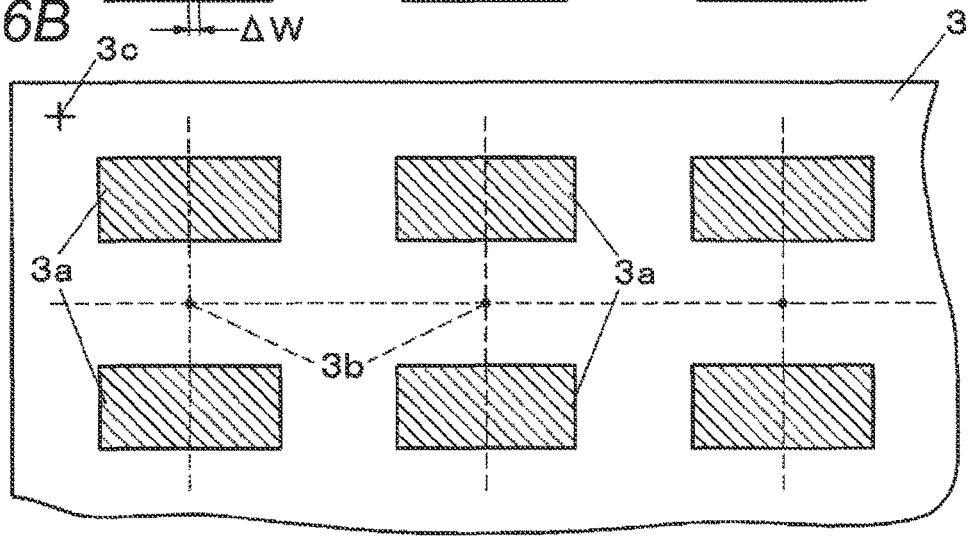
Figure 6C:
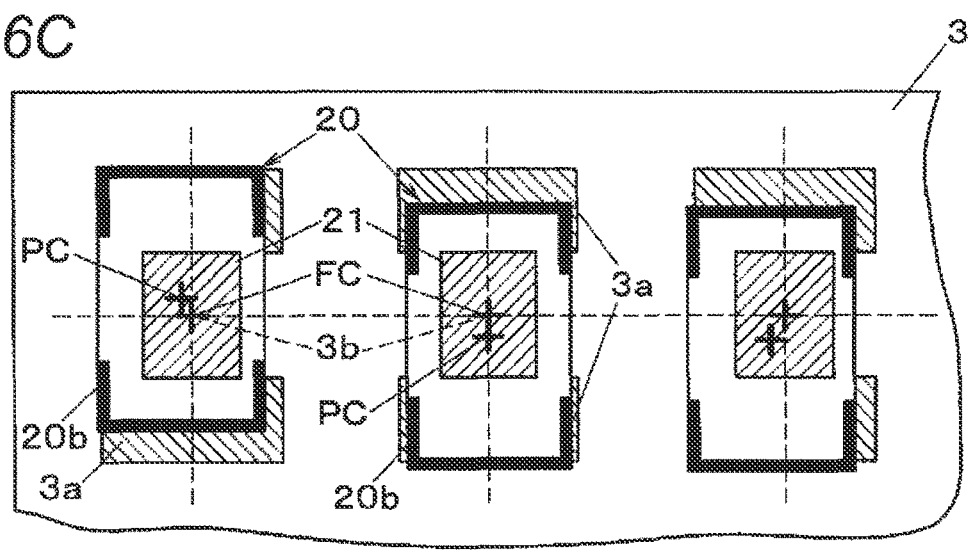

To solve the above problem, in the electronic component mounting system 1 according to the embodiment, as shown in FIGS. 6A-6C, positional deviations $\Delta W$ and $\Delta L$ of the emission portion position FC from the component center PC of an actual light-emitting element 20 are detected by image recognition before mounting it on a board 3 and the mounting position of the light-emitting element 20 on the board 3 is corrected based on the detected positional deviations $\Delta W$ and $\Delta L$. Thus, occurrence of positional deviations of the emission portion position FC in a mounted state is prevented.

FIG. 6A shows light-emitting elements 20 before mounting which are subjects of detection of positional deviations $\Delta W$ and $\Delta L$. In the embodiment, when each light-emitting element 20 is picked up from the component supply unit 14 by the component mounting head 11, an image of the top surface thereof (see FIG. 6A) is obtained by the board recognition camera 12. In this manner, a position of the component center PC which is the center of each light-emitting element 20 and a position of the emission portion position FC which is the center of the emission portion 21 are recognized. And positional deviations $\Delta W$ and $\Delta L$ (see FIG. 5) of the light-emitting element 20 are detected based on recognition results.

As for a board 3 on which light-emitting elements 20 are to be mounted, positions of mounting coordinates points 3b of respective pairs of lands 3a are detected by recognizing the board recognition mark 3c formed on the board 3 by obtaining the image thereof with the board recognition camera 12. In a mounting operation of mounting the light-emitting elements 20 on the board 3, as shown in FIG. 6C, the positions of component mounting by the component mounting head 11 are corrected so that the emission portion positions FC coincide with the respective mounting coordinates points 3b. That is, each light-emitting element 20 is placed on the corresponding lands 3a after correcting its mounting position by the positional deviations $\Delta W$ and $\Delta L$ from its mounting position of the positioning method in which the component center PC is positioned so as to coincide with the mounting coordinates point 3b.

Figure 3:
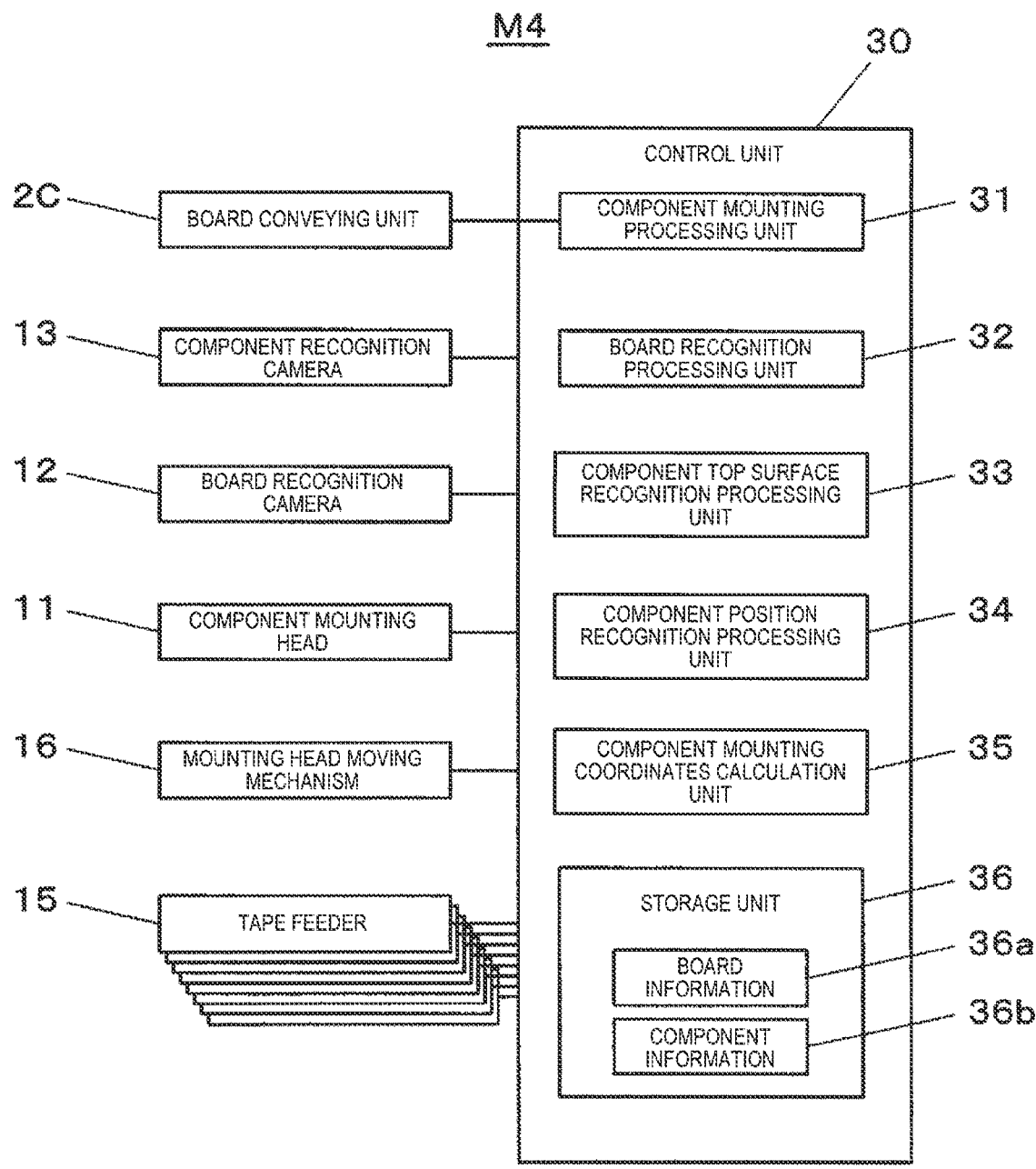
FIG. 3 is a block diagram showing the configuration of a control system of an electronic component mounting machine according to the first embodiment of the invention.

Next, the configuration of a control system 30 of the electronic component mounting machine M4 according to the first embodiment will be described with reference to FIG. 3.

In the electronic component mounting machine M4, the control system 30 incorporates, as units in charge of internal processing functions, a component mounting processing unit 31, a board recognition processing unit 32, a component top surface recognition processing unit 33, a component position recognition processing unit 34, and a component mounting coordinates calculation unit 35. The control system 30 also incorporates a storage unit 36 which is stored with board information 36a and component information 36b, which are design information of the board 3 and the light-emitting element 20 as subjects of a mounting operation. The board information 36a and the component information 36b indicate sets of coordinates of the lands 3a and the mounting coordinates points 3b, positional relationships between the mounting coordinates points 3b and the board recognition mark 3c, the shape of the light-emitting element 20, etc. The board conveying mechanism 2C, the component recognition camera 13, the board recognition camera 12, the component mounting head 11, the mounting head moving mechanism 16, and the tape feeders 15 are connected to the control unit 30.

The component mounting processing unit 31 performs component mounting processing for picking up light-emitting elements 20 from the tape feeders 15 and moving and mounting them to and on the board 3 by controlling the board conveying mechanism 2C, the component mounting head 11, the mounting head moving mechanism 16, and the tape feeders 15. In performing the component mounting processing, the component mounting processing unit 31 refers to results of a component mounting coordinates calculation (described later) that is performed by the component mounting coordinates calculation unit 35.

The board recognition processing unit 32 detects positions of mounting coordinates points 3b (see FIGS. 4B and 6B) for light-emitting elements 20 on the board 3 by performing recognition processing on a result of obtaining the image of the board recognition mark 3c (see FIG. 6B) formed on the board 3 by the board recognition camera 12. The component top surface recognition processing unit 33 recognizes positions of the component center PC of each light-emitting element 20 and the emission portion position FC of the emission portion 21 formed in the top surface of the light-emitting element 20 by performing recognition processing on a result of obtaining the image of the top surface of the light-emitting element 20 by the board recognition camera 12 done at the time of picking it up by the component mounting head 11, and thereby detects positional deviations $\Delta W$ and $\Delta L$ (see FIG. 5). As such, the component recognition camera 13 and the component top surface recognition processing unit 33 serve as an emission portion detecting unit for detecting positional deviations of the emission portion 21 of each light-emitting element 20.

The component position recognition processing unit 34 recognizes a position of the light-emitting element 20 in a state of being held by an absorption nozzle of the component mounting head 11 by performing recognition processing on a result of obtaining the image of the back surface of the light-emitting element 20 by the component recognition camera 13. As such, the component recognition camera 13 and the component position recognition processing unit 34 serve as a light-emitting element position detecting unit for detecting a position of each light-emitting element 20 in a state of being absorbed and held by an absorption nozzle of the electronic component mounting machine M4 based on an image of the back surface of the light-emitting element 20.

The component mounting coordinates calculation unit 35 performs processing of calculating component mounting coordinates to be used for positioning the emission portion position FC of each light-emitting element 20 being held by the component mounting head 11 so as to coincide with the corresponding mounting coordinates point 3b on the board 3 based on results of pieces of recognition processing of the board recognition processing unit 32, the component top surface recognition processing unit 33, and the component position recognition processing unit 34. The absorption nozzle, holding the light-emitting element 20, of the component mounting head 11 is moved relative to the board 3 as the component mounting processing unit 31 controls the mounting head moving mechanism 16 based on the calculated component mounting coordinates, whereby the emission portion 21 is placed at the corresponding mounting coordinates point 3b (i.e., at the prescribed position on the board 3). At this time, the light-emitting element 20 is positioned with respect to the board 3 so as to be shifted by its positional deviations $\Delta W$ and $\Delta L$ shown in FIG. 6A.

As such, the mounting head moving mechanism 16, the component mounting processing unit 31, and the component mounting coordinates calculation unit 35 constitute a light-emitting element positioning unit which positions each light-emitting element 20 with respect to the board 3 by shifting it by its positional deviations $\Delta W$ and $\Delta L$ by moving the absorption nozzle, holding the light-emitting element 20, of the component mounting head 11 relative to the board 3 using the positional deviations $\Delta W$ and $\Delta L$ detected by the emission portion detecting unit and a position of the light-emitting element 20 detected by the light-emitting element position detecting unit, to place the emission portion 21 of the light-emitting element 20 at the prescribed position on the board 3.

By lowering the absorption nozzle that is holding the light-emitting element 20 that has been positioned with respect to the board 3, the terminals 20b of the light-emitting element 20 are brought into contact with the solder paste S formed on the respective lands 3a. At the same time, the main body 20a of the light-emitting element 20 comes into contact with the spots of adhesive A formed on the board 3 (refer to step ST4 shown in FIG. 7). As such, the component mounting processing unit 31 and the component mounting head 11 serve as a light-emitting element mounting unit which lowers the absorption nozzles toward the board 3 and thereby brings the terminals 20b of each light-emitting element 20 into contact with the solder paste S formed on the respective lands 3a and brings the main body 20a of the light-emitting element 20 into contact with the spots of adhesive A formed on the board 3.

Next, the electronic component mounting method of mounting light-emitting elements 20 on the board 3 by soldering in the electronic component mounting system 1 will be described with reference to FIG. 7. FIG. 7 includes diagrams that illustrate operations performed at respective processing steps of the electronic component mounting method.

First, at step ST1, a board 3 is carried into the screen printing machine M2 and subjected to screen printing there. That is, solder paste S is placed on pairs of lands 3a that are formed on the top surface of the board 3 (solder paste supply step). At step ST2, the board 3 is carried into the adhesive applying machine M3 and thermosetting adhesive is applied to it there.

That is, spots of adhesive A for fixing light-emitting elements 20 to the board 3 are formed on the top surface of the board 3 between each of the pairs of lands 3a (adhesive application step). The adhesive A is a thermosetting adhesive having a curing characteristic that the curing reaction peaks at a lower temperature than the melting temperature of the solder in the solder paste S. Spots of adhesive A are formed at such positions on two respective sides of each mounting coordinates point 3b on the top surface of the board 3 as to come into contact with the bottom surface of the corresponding light-emitting element 20 when it is mounted.

The board 3 is then carried into the electronic component mounting machine M4. In the electronic component mounting machine M4, first, at step ST3, emission portion positions FC (positional deviations) are detected. That is, the component mounting head 11 is moved to over the component supply unit 14, an image of the top surface of each light-emitting element 20 being held by a tape feeder 15 is obtained by the board recognition camera 12 which is attached to the component mounting head 11, and recognition processing is performed on a recognition result by the component top surface recognition processing unit 33. As a result, positions of the component center PC and the emission portion position FC are recognized and positional deviations ΔW and ΔL (see FIG. 5) of the emission portion 21 of the light-emitting element 20 are detected (emission portion detecting step).

At step ST4, light-emitting elements 20 (electronic components) are mounted as the component mounting processing unit 31 controls the component mounting head 11 and the mounting head moving mechanism 16. More specifically, first, each light-emitting element 20 is picked by absorbing and holding its top surface by an absorption nozzle of the component mounting head 11 and is moved to over the component recognition camera 13. The image of the back surface of the light-emitting element 20 in a state of being held by the absorption nozzle is obtained by the component recognition camera 13. A result of obtaining the image is recognized by the component position recognition processing unit 34, whereby a position of the light-emitting element 20 is recognized. That is, a position of the light-emitting element 20 is detected based on an obtained image of its back surface (light-emitting element position detecting step).

Subsequently, to place the emission portion 21 of each light-emitting element 20 at the prescribed position on the board 3, the light-emitting element 20 is positioned with respect to the board 3 by shifting the light-emitting element 20 by its positional deviations ΔW and ΔL by moving the absorption nozzle relative to the board 3 using the positional deviations ΔW and ΔL detected at the emission portion detecting step and the position of the light-emitting element 20 detected at the light-emitting element position detecting step (light-emitting elements positioning step). Then the absorption nozzle of the component mounting head 11 is lowered toward the board 3, whereby the terminals 20b of each light-emitting element 20 are brought into contact with the solder paste S formed on the corresponding lands 3a and the main body 20a of the light-emitting element 20 are brought into contact with the corresponding spots of adhesive A formed on the board 3 (light-emitting element mounting step). As a result, each light-emitting element 20 is temporarily fixed to the top surface of the board 3 by means of the solder paste S and the adhesive A with its emission portion position FC positioned so as to coincide with the corresponding mounting coordinates point 3b. The board 3 in this state is carried into the reflow machine M5.

In the reflow machine M5, the board 3 is heated according to a preset heating profile, whereby first the adhesive A is cured and the light-emitting elements 20 are thereby fixed to the board (adhesive curing step). In the embodiment, since a thermosetting adhesive is used as the adhesive A, the adhesive curing step is a preliminary heating step (step ST5) in which the board 3 is heated at a temperature than is lower than the melting temperature of the solder in the solder paste S and higher than or equal to a temperature at which the curing reaction of the thermosetting adhesive starts to be promoted. The adhesive A are cured by the preliminary heating to become adhesive portions A* which fix the light-emitting elements 20 to the board 3.

Then the board 3 is moved in the reflow machine M5 and a transition is made to a heating step for soldering which is executed according the remaining part of the heating profile. At this heating step (step ST6, reflow step), the solder in the solder paste S is melted in the state that the light-emitting elements 20 are fixed to the board 3 by the adhesive portions A* (i.e., the cured adhesive A), whereby the terminals 20b of the light-emitting elements 20 are connected to the lands 3a of the board 3 electrically and mechanically. The reflow step is continuous with the preliminary heating step (both steps are executed in the reflow machine M5) and is executed by heating the board 3 at a temperature that is higher than or equal to the melting temperature of the solder.

The solder is solidified to become solder portions S* which fix the terminals 20b of the light-emitting elements 20 to the lands 3a of the board 3 by soldering. In this soldering, since the solder is melted in the state that the light-emitting elements 20 are fixed to the board 3 by the adhesive portions A*, the reflow step is free of self-alignment action in which the terminals 20b are attracted by the lands 3a due to surface tension of molten solder. Therefore, the light-emitting elements 20 are soldered to the board 3 while being kept in the state of step ST4; even after the soldering, the emission portion position FC of the emission portions 21 coincide with the respective mounting coordinates points 3b on the board 3.

A photocurable adhesive (resin) may be used as the adhesive A instead of a thermosetting adhesive which is used in the embodiment. In this case, the above-described adhesive curing step is replaced by a light illumination step in which the board 3 is illuminated with light for accelerating curing of the photocurable adhesive. An adhesive that is neither a thermosetting adhesive nor a photocurable adhesive may be used in the invention as long as it exhibits such a curing characteristic as to be cured, for example, naturally to some extent to produce adhesion that is sufficient to prevent self-alignment action (mentioned above).

Figure 8:
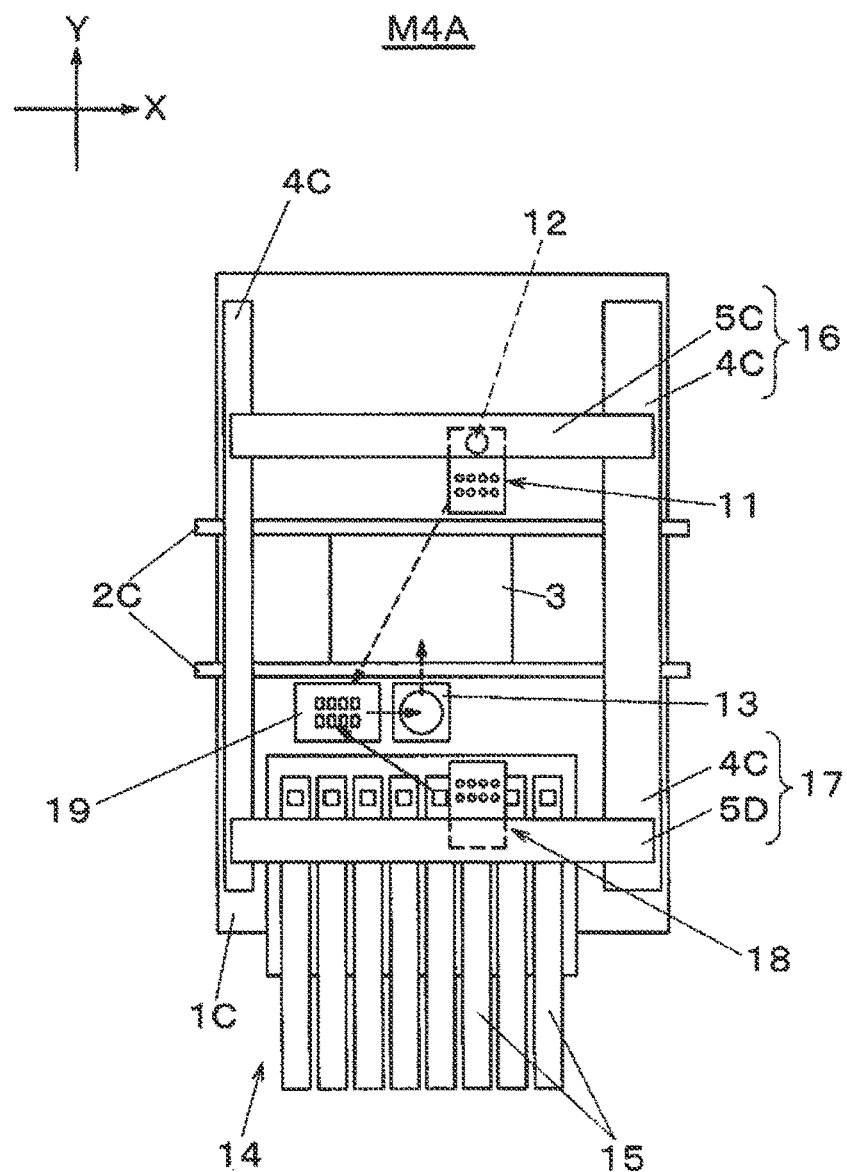
FIG. 8 is a plan view of an electronic component mounting machine according to a second embodiment of the invention.

As for the configuration of the emission portion detecting unit for detecting positional deviations of the emission portion 21 formed in the top surface of each light-emitting element 20, FIG. 8 shows an electronic component mounting machine M4A according to a second embodiment which is equipped with a temporary placement stage 19 on which light-emitting elements 20 that have been picked up from the tape feeders 15 are placed temporarily for obtaining an image. The electronic component mounting machine M4A is different from the electronic component mounting machine M4 shown in FIG. 2 in that the temporary placement stage 19 is disposed adjacent to the component recognition camera 13 and a transfer means is added which transfers light-emitting elements 20 that have been picked up from the tape feeders 15 onto the temporary placement stage 19. The transfer means is configured in such a manner that a component transfer head 18 is mounted on an X-axis moving mechanism 5D which is moved in the Y direction by the Y-axis moving mechanism 4C. The component transfer head 18 can be moved to any position over the component supply unit 14 or the temporary placement stage 19 by a transfer head moving mechanism 17 which is composed of the Y-axis moving mechanism 4C and the X-axis moving mechanism 5D.

The electronic component mounting machine M4A performs an electronic component mounting operation in the following manner. In FIG. 8, a solid-line arrow indicates a movement of the component transfer head 18 and broken-line arrows indicate movements of the component mounting head 11. First, light-emitting elements 20 are picked up successively from the tape feeders 15 by the component transfer head 18. And the component mounting head 11 is moved to over the board 3, and an image of the board recognition mark 3c of the board 3 is obtained by the board recognition camera 12, whereby positions of the mounting coordinates points 3b are recognized. Subsequently, the light-emitting elements 20 being absorbed and held by the component transfer head 18 are placed on the temporary placement stage 19 by the component transfer head 18. Then the component mounting head 11 is moved to the temporary placement stage 19, and an image of the light-emitting element 20 being placed thereon temporarily is obtained by the board recognition camera 12.

Recognition processing is performed on results of obtaining the image by the component top surface recognition processing unit 33 (see FIG. 3), whereby positional deviations $\Delta W$ and $\Delta L$ of the emission portion position FC of the emission portion 21 from the component center PC of each light-emitting element 20 are detected in the same manner as in the first embodiment. Although in this embodiment the image of the light-emitting elements 20 on the temporary placement stage 19 is obtained by the board recognition camera 12 which is attached to the component mounting head 11, they may be obtained by a camera that is attached to the component transfer head 18 and has the same function as the board recognition camera 12.

Subsequently, the component mounting head 11 that has picked up the light-emitting elements 20 from the temporary placement stage 19 is moved to over the component recognition camera 13. The image of the light-emitting elements 20 being held by the component mounting head 11 is obtained from below by the component recognition camera 13. Recognition processing is performed on results of obtaining the image by the component position recognition processing unit 34, whereby positions of the light-emitting elements 20 are recognized. Then the component mounting head 11 is moved to over the board 3 and the light-emitting elements 20 being absorbed and held by the absorption nozzles are mounted on the board 3 at the respective mounting coordinates points 3b. The light-emitting elements 20 are mounted based on the mounting coordinates points 3b, the positional deviations $\Delta W$ and $\Delta L$, and the positions that have been recognized through obtaining the image by the board recognition camera 12 and the component recognition camera 13.

The electronic component mounting machine M4A according to the second embodiment can make the efficiency of a component mounting operation higher than the electronic component mounting machine M4 according to the first embodiment because light-emitting elements 20 are picked up successively from the tape feeders 15 by the component transfer head 18 and mounted on the board 3 by the component mounting head 11.

As described above, in the embodiments, light-emitting elements 20 as electronic components are mounted on a board 3 by soldering in the following manner. Spots of adhesive A for fixing of light-emitting elements 20 to the board 3 are formed on the top surface of the board 3. Positional deviations $\Delta W$ and $\Delta L$ of the emission portion 21 of each light-emitting element 20 are detected and a position of the light-emitting element 20 is detected based on an image of the back side of the light-emitting element 20. To place the emission portion 21 at the prescribed position on the board 3, the light-emitting element 20 is positioned with respect to the board 3 by shifting the light-emitting element 20 by its positional deviations $\Delta W$ and $\Delta L$ using the positional deviations $\Delta W$ and $\Delta L$ detected at the emission portion detecting step and the position of the light-emitting element 20 detected at the light-emitting element position detecting step. Subsequently, solder is melted in the state that the adhesive A is cured and the light-emitting elements 20 are thereby fixed to the board 3, whereby the terminals 20b of the light-emitting elements 20 are connected to the lands 3a of the board 3 electrically and mechanically.

As a result, even if the emission portion positions FC of light-emitting elements 20 have a variation, the light-emitting elements 20 can be mounted on a board 3 with the emission portions 21 positioned so as to coincide with the prescribed positions of the board 3. Furthermore, since the adhesive A can prevent the phenomenon that the light-emitting elements 20 are moved due to self-alignment action when the solder is melted in a reflow process, the light-emitting elements 20 can be mounted on the board 3 by soldering with high positioning accuracy.

Providing the advantage that a light-emitting element as an electronic component can be mounted on a board by soldering with high positioning accuracy, the electronic component mounting system, the electronic component mounting method, and the electronic component mounting machine according to the embodiment of the invention are useful in the field of manufacturing an illumination board by mounting light-emitting elements such as LEDs on a board.

What is claimed is:

1. An electronic component mounting method for mounting a light-emitting element as an electronic component on a board by soldering, said electronic component mounting method comprising:

placing solder paste on a pair of lands formed on a top surface of the board;

placing adhesive for fixing of the light-emitting element to the board, on the board between each of the pairs of lands;

detecting a positional deviation of an emission portion formed in a top surface of the light-emitting element;

detecting a position of the light-emitting element based on an image of a back surface of the light-emitting element which is obtained in a state in which the top surface of the light-emitting element is absorbed and held by an absorption nozzle of an electronic component mounting machine;

positioning the light-emitting element with respect to the board by shifting the light-emitting element by its positional deviation by moving the absorption nozzle relative to the board using the detected positional deviation and the detected position of the light-emitting element, to place the emission portion at a prescribed position on the board;

lowering the absorption nozzle toward the board such that terminals of the light-emitting element contact the solder paste formed on the respective lands and such that a main body of the light-emitting element contacts the adhesive formed on the board;

curing the adhesive and fixing the light-emitting element to the board; and performing reflow process to melt solder in the solder paste in a state in which the light-emitting element is fixed to the board by the cured adhesive, and connecting the terminals of the light-emitting element to the respective lands of the board electrically and mechanically.

2. The electronic component mounting method according to claim 1, wherein the adhesive comprises a thermosetting adhesive having a curing reaction peak at a temperature lower than a melting temperature of the solder, wherein said curing of the adhesive comprises a preliminary heating process in which the board is heated at a temperature lower than the melting temperature of the solder and equal to or higher than a temperature at which curing reaction of the thermosetting adhesive starts to be promoted, and wherein the board is heated in the reflow process at a temperature equal to or higher than the melting temperature of the solder continuously with heating by the preliminary heating process.

3. The electronic component mounting method according to claim 1, wherein the adhesive comprises a photocurable adhesive, and wherein said curing the adhesive comprises illuminating the board with light which promotes curing of the photocurable adhesive.

4. An electronic component mounting method in which a light-emitting element is mounted as an electronic component on a board, the light-emitting element comprising a main body, a terminal formed on the main body, and an emission portion formed in a top surface of the main body, such that the light-emitting element is temporarily fixed to the board by solder paste and adhesive, the adhesive is cured to form an adhesive portion which fixes the main body of the light-emitting element to the board, and solder in the solder paste is melted to form a solder portion which bonds the terminal of the light-emitting element to a land of the board electrically and mechanically; said electronic components mounting method comprising:

detecting a positional deviation of the emission portion in a top surface of the light-emitting element;

holding the light-emitting element by an absorption nozzle;

detecting a position of the light-emitting element in a state in which the light-emitting element is held by the absorption nozzle;

positioning the emission portion to a prescribed position on the board by moving the absorption nozzle based on the positional deviation of the emission portion and the position of the light-emitting element;

lowering the absorption nozzle to mount the light-emitting element on the board at a position deviated from the prescribed position on the board by the positional deviation;

curing the adhesive to form the adhesive portion; and heating the board which is mounted with the light-emitting element to melt the solder to form the solder portion.

5. The electronic component mounting method according to claim 4, wherein the adhesive comprises a thermosetting adhesive having a curing reaction peak at a temperature lower than a melting temperature of the solder, and wherein the adhesive portion and the solder portion are formed by continuously performing preliminary heating and a reflow process, the preliminary heating comprising heating the board mounted with the light-emitting element at a temperature lower than the melting temperature of the solder and equal to or higher than a temperature at which the curing reaction of the thermosetting adhesive starts to be promoted, and the reflow process comprising heating the board at a temperature equal to or higher than the melting temperature of the solder.

6. The electronic component mounting method according to claim 4, wherein the adhesive comprises a photocurable adhesive, and wherein the adhesive portion is formed by illuminating the board with light which promotes curing of the photocurable adhesive.

7. The electronic component mounting method according to claim 4, wherein the positional deviation is a positional deviation of the emission portion from a center of the light-emitting element.

8. The electronic component mounting method according to claim 7, wherein the light-emitting element is mounted such that the center of the light-emitting element is deviated by the positional deviation from a mounting coordinates point indicating the prescribed position on the board.

9. The electronic component mounting method according to claim 4, wherein the absorption nozzle holds the top surface of the light-emitting element, and wherein the position of the light-emitting element is detected from below in a state in which the top surface of the light-emitting element is held by the absorption nozzle.

* * * * *